United States Patent
Weatherspoon et al.

(10) Patent No.: US 9,691,698 B2
(45) Date of Patent: Jun. 27, 2017

(54) METHOD OF TRANSFERRING AND ELECTRICALLY JOINING A HIGH DENSITY MULTILEVEL THIN FILM TO A CIRCUITIZED AND FLEXIBLE ORGANIC SUBSTRATE AND ASSOCIATED DEVICES

(71) Applicant: HARRIS CORPORATION, Melbourne, FL (US)

(72) Inventors: Michael Raymond Weatherspoon, West Melbourne, FL (US); David B. Nicol, Melbourne, FL (US); Louis Joseph Rendek, Jr., Melbourne, FL (US)

(73) Assignee: HARRIS CORPORATION, Melbourne, FL (US)

( * ) Notice: Subject to any disclaimer, the term of this patent is extended or adjusted under 35 U.S.C. 154(b) by 0 days.

(21) Appl. No.: 15/205,416

(22) Filed: Jul. 8, 2016

(65) Prior Publication Data

US 2016/0322284 A1 Nov. 3, 2016

Related U.S. Application Data

(62) Division of application No. 14/483,934, filed on Sep. 11, 2014, now Pat. No. 9,420,687, which is a division
(Continued)

(51) Int. Cl.
*H05K 1/00* (2006.01)
*H01L 23/498* (2006.01)
(Continued)

(52) U.S. Cl.
CPC ........ *H01L 23/4985* (2013.01); *H01L 21/486* (2013.01); *H01L 21/4853* (2013.01);
(Continued)

(58) Field of Classification Search
CPC .. H05K 1/00; H05K 1/02; H05K 1/10; H05K 1/11; H05K 3/10; H05K 3/46; H01L 21/48; H01L 21/486; H03L 23/13; H03L 23/48
(Continued)

(56) References Cited

U.S. PATENT DOCUMENTS

| 5,303,862 A | 4/1994 | Bross et al. |
| 5,534,094 A | 7/1996 | Arjavalingam et al. |

(Continued)

FOREIGN PATENT DOCUMENTS

| JP | 2003249765 | 9/2003 |
| KR | 1020100055011 | 5/2010 |

OTHER PUBLICATIONS

Culbertson, Edwin C., "A New Laminate Material for High Performance PCBs: Liquid Crystal Polymer Copper Clad Films," IEEE, pp. 520-523, 1995.
(Continued)

*Primary Examiner* — Xiaoliang Chen
(74) *Attorney, Agent, or Firm* — Allen, Dyer, Doppelt + Gilchrist, P.A.

(57) ABSTRACT

A method is for making an electronic device and includes forming an interconnect layer stack on a sacrificial substrate and having a plurality of patterned electrical conductor layers, and a dielectric layer between adjacent patterned electrical conductor layers. The method also includes laminating and electrically joining through an intermetallic bond a liquid crystal polymer (LCP) substrate to the interconnect layer stack on a side thereof opposite the sacrificial substrate. The method further includes removing the sacrificial substrate to expose a lowermost patterned electrical conductor layer, and electrically coupling at least one first device to the lowermost patterned electrical conductor layer.

24 Claims, 17 Drawing Sheets

Related U.S. Application Data of application No. 13/006,973, filed on Jan. 14, 2011, now Pat. No. 8,867,219.

(51) Int. Cl.

| | | |
|---|---|---|
| *H01L 21/683* | (2006.01) | |
| *H01L 25/065* | (2006.01) | |
| *H05K 1/18* | (2006.01) | |
| *H01L 25/00* | (2006.01) | |
| *H01L 23/538* | (2006.01) | |
| *H05K 1/03* | (2006.01) | |
| *H05K 1/11* | (2006.01) | |
| *H05K 3/32* | (2006.01) | |
| *H05K 3/40* | (2006.01) | |
| *H01L 21/48* | (2006.01) | |
| *H05K 3/34* | (2006.01) | |
| *H05K 3/46* | (2006.01) | |
| *H01L 23/00* | (2006.01) | |

(52) U.S. Cl.
CPC ...... *H01L 21/4857* (2013.01); *H01L 21/6835* (2013.01); *H01L 23/49822* (2013.01); *H01L 23/49827* (2013.01); *H01L 23/49838* (2013.01); *H01L 23/49894* (2013.01); *H01L 23/5383* (2013.01); *H01L 24/17* (2013.01); *H01L 24/81* (2013.01); *H01L 25/0652* (2013.01); *H01L 25/0655* (2013.01); *H01L 25/0657* (2013.01); *H01L 25/50* (2013.01); *H05K 1/036* (2013.01); *H05K 1/0393* (2013.01); *H05K 1/115* (2013.01); *H05K 1/181* (2013.01); *H05K 1/189* (2013.01); *H05K 3/32* (2013.01); *H05K 3/4038* (2013.01); *H05K 3/467* (2013.01); *H05K 3/4688* (2013.01); *H01L 24/16* (2013.01); *H01L 2221/68345* (2013.01); *H01L 2221/68359* (2013.01); *H01L 2221/68363* (2013.01); *H01L 2221/68381* (2013.01); *H01L 2224/16225* (2013.01); *H01L 2224/16227* (2013.01); *H01L 2224/32225* (2013.01); *H01L 2224/48* (2013.01); *H01L 2224/48091* (2013.01); *H01L 2224/48106* (2013.01); *H01L 2224/48229* (2013.01); *H01L 2224/73204* (2013.01); *H01L 2224/81191* (2013.01); *H01L 2225/0651* (2013.01); *H01L 2225/06517* (2013.01); *H01L 2225/06548* (2013.01); *H01L 2225/06572* (2013.01); *H01L 2924/0105* (2013.01); *H01L 2924/01029* (2013.01); *H01L 2924/01327* (2013.01); *H01L 2924/12042* (2013.01); *H01L 2924/14* (2013.01); *H01L 2924/1421* (2013.01); *H01L 2924/1431* (2013.01); *H01L 2924/1511* (2013.01); *H01L 2924/1579* (2013.01); *H05K 3/3436* (2013.01); *H05K 3/4602* (2013.01); *H05K 3/4632* (2013.01); *H05K 2201/0133* (2013.01); *H05K 2201/0141* (2013.01); *H05K 2201/10674* (2013.01); *Y10T 29/4913* (2015.01); *Y10T 29/49224* (2015.01); *Y10T 428/24917* (2015.01)

(58) Field of Classification Search
USPC ........ 174/250, 251, 255, 260, 261; 361/750, 361/760, 795; 257/173, 531, 699, 700; 29/846
See application file for complete search history.

(56) References Cited

U.S. PATENT DOCUMENTS

| | | | |
|---|---|---|---|
| 6,163,957 A | 12/2000 | Jiang et al. | |
| 6,183,588 B1 | 2/2001 | Kelly et al. | |
| 6,326,555 B1 | 12/2001 | McCormack et al. | |
| 6,334,922 B1 | 1/2002 | Tanaka et al. | |
| 6,372,992 B1 | 4/2002 | Yang | |
| 6,414,849 B1 | 7/2002 | Chiu | |
| 6,759,600 B2 | 7/2004 | Koyama et al. | |
| 6,931,723 B1 | 8/2005 | Powell | |
| 6,998,327 B2 | 2/2006 | Danielson et al. | |
| 7,408,258 B2 | 8/2008 | Salmon | |
| 8,632,874 B2* | 1/2014 | Paul | B32B 7/12 428/195.1 |
| 2003/0147227 A1* | 8/2003 | Egitto | H01L 21/4853 361/795 |
| 2003/0180510 A1 | 9/2003 | Ogawa et al. | |
| 2003/0184987 A1 | 10/2003 | Coomer et al. | |
| 2003/0203171 A1 | 10/2003 | Higashitani | |
| 2004/0000425 A1* | 1/2004 | White | H01F 41/041 174/250 |
| 2004/0005443 A1 | 1/2004 | Suzuki et al. | |
| 2004/0053444 A1 | 3/2004 | Yoneda et al. | |
| 2004/0089470 A1* | 5/2004 | Shimoto | H01L 23/145 174/250 |
| 2004/0105989 A1 | 6/2004 | Ohta et al. | |
| 2004/0140551 A1* | 7/2004 | Usui | H01L 21/6835 257/700 |
| 2004/0151883 A1 | 8/2004 | Higashitani | |
| 2004/0151884 A1 | 8/2004 | Higashitani | |
| 2004/0171190 A1 | 9/2004 | Nishitani et al. | |
| 2004/0202781 A1 | 10/2004 | Higashitani | |
| 2004/0256731 A1 | 12/2004 | Mao et al. | |
| 2005/0001331 A1 | 1/2005 | Kojima et al. | |
| 2005/0037535 A1 | 2/2005 | Ogawa et al. | |
| 2005/0112798 A1 | 5/2005 | Bjorbell | |
| 2005/0146403 A1 | 7/2005 | Okubora | |
| 2005/0150686 A1* | 7/2005 | Powell | H05K 3/4617 174/262 |
| 2005/0248418 A1 | 11/2005 | Govind et al. | |
| 2005/0281995 A1 | 12/2005 | Murai et al. | |
| 2006/0017152 A1 | 1/2006 | White et al. | |
| 2006/0068576 A1 | 3/2006 | Burdick, Jr. et al. | |
| 2007/0004844 A1 | 1/2007 | Clough et al. | |
| 2007/0025092 A1 | 2/2007 | Lee et al. | |
| 2007/0085108 A1 | 4/2007 | White et al. | |
| 2007/0107932 A1 | 5/2007 | Jauniskis et al. | |
| 2007/0125574 A1 | 6/2007 | Kim et al. | |
| 2008/0116611 A1 | 5/2008 | Ogawa et al. | |
| 2008/0168999 A1 | 7/2008 | Hong | |
| 2008/0277775 A1 | 11/2008 | Honer et al. | |
| 2009/0000804 A1 | 1/2009 | Kobayashi et al. | |
| 2009/0008133 A1 | 1/2009 | Bullard et al. | |
| 2009/0084595 A1* | 4/2009 | Park | H05K 3/281 174/261 |
| 2009/0145651 A1 | 6/2009 | Yoshino et al. | |
| 2009/0314525 A1 | 12/2009 | Kajino et al. | |
| 2010/0066683 A1 | 3/2010 | Chang et al. | |
| 2010/0176480 A1 | 7/2010 | Senda et al. | |
| 2010/0215884 A1 | 8/2010 | Kitada et al. | |
| 2010/0301450 A1 | 12/2010 | Lin | |
| 2012/0031649 A1* | 2/2012 | Antesberger | H05K 3/4069 174/251 |
| 2012/0098129 A1* | 4/2012 | Reed | H01L 21/4857 257/738 |
| 2012/0160544 A1* | 6/2012 | Antesberger | H05K 3/4623 174/251 |

OTHER PUBLICATIONS

Narayan, C., et al., "Thin Film Transfer Process for Low Cost MCM's", IEEE/CHMT Int'l Electronics Manufacturing Technology Symposium, pp. 373-380, 1993.

(56) References Cited

OTHER PUBLICATIONS

T. Zhang et al., "The Processing and Assembly of Liquid Crystalline Polymer Printed Circuits," 2002 Int. Symposium on Microelectronics, pp. 1-9, 2002.

T. Zhang, et al., "Flexible Electronics: Thin Silicon Die on Flexible Substrates", IEEE Transactions on Electronics Packaging Manufacturing, vol. 32, No. 4, pp. 291-300, (2009).

\* cited by examiner

METHOD OF TRANSFERRING AND ELECTRICALLY JOINING A HIGH DENSITY MULTILEVEL THIN FILM TO A CIRCUITIZED AND FLEXIBLE ORGANIC SUBSTRATE AND ASSOCIATED DEVICES

FIELD OF THE INVENTION

The present invention relates to the field of electronic device fabrication and, more particularly, to methods of forming portions of electronic devices on sacrificial substrates and electrically joining them to circuitized thin flexible organic substrates.

BACKGROUND OF THE INVENTION

As semiconductor and integrated circuit technology has advanced, there has been a trend toward high-functionality integrated circuit components with numerous input and output (I/O) pads, together with a demand for reduced chip size, weight, and power consumption. Consequently, as integrated circuits get smaller, they increasingly have smaller I/O pads arranged more closely together than ever before.

To match these high functionality integrated circuits, there is a demand for printed wiring boards having closely arranged pads for integrated circuit component attachment. To date, the ability to fabricate substrates with sufficiently fine pitch component attach pads has not been able to keep up with miniaturization in integrated circuit components. Consequently, there is an interconnection technology gap for some modern devices.

To make such devices function, printed wiring boards may have extra routing layers to handle the pads of the integrated circuits, or utilize fan-out packaging. This results in the package size of an integrated circuit being larger than the integrated circuit itself, which may limit system miniaturization. In addition to these desires for miniaturized devices, it is also desirable in some cases to construct these devices from a flexible, and not rigid, substrate.

One material now being used as a substrate from which to construct thin and flexible printed wiring boards is biaxially-oriented liquid crystal polymer (LCP). The molecules in LCPs have rigid, rod-like shapes, and maintain a crystalline order when in a liquid phase or when heated and melted. *The Processing and Assembly of Liquid Crystalline Polymer Printed Circuits*, T. Zhang, W. Johnson, B. Farrell, and M. St. Lawrence, "The processing and assembly of liquid crystalline polymer printed circuits," 2002 *Int. Symp. on Microelectronics,* 2002. discusses the construction of a printed circuit board using LCP as a substrate. A photoresist is first applied to a copper clad laminate, exposed, and developed to define a desired circuit pattern. The actual circuit is defined by etch removal of any exposed copper. Holes or vias are created in the substrate via mechanical or laser drilling. A desmearing step is performed to remove debris from the vias or holes, thereby preparing the LCP material for metal deposition. A metalization step is next performed, and a conventional solder mask is applied to the LCP substrate. Solder is then applied through the conventional solder mask to complete the construction of the LCP printed circuit board.

While this design does allow for the creation of thin, flexible printed circuit boards, it still suffers from the same drawbacks as described above with respect to the attachment of integrated circuits with closely spaced pads.

Traditional semiconductor processing techniques allow for fabrication of rigid, wafer substrates that would support the levels of component attached referenced above. In this process, metals are deposited from the vapor phase into very thin films and are lithographically patterned and etched similar to that described for printed circuit boards. Dielectric layers are formed between metal layers through a spun on or vapor phase deposition process. While allowing for attachment of fine pitch components, this approach lacks the ability to achieve flexible circuits due to the rigid wafer substrate requirement for semiconductor processing. As such, additional methods of connecting integrated circuits to flexible printed circuit boards are needed.

SUMMARY OF THE INVENTION

In view of the foregoing background, it is therefore an object of the present invention to provide a method of transferring and electrically joining a high density multilevel thin film fabricated on a sacrificial rigid wafer substrate to a flexible, circuitized liquid crystal polymer substrate.

This and other objects, features, and advantages in accordance with the present invention are provided by a method of making an electronic device including forming an interconnect layer stack on a sacrificial substrate comprising a plurality of alternating patterned electrically conducting and dielectric layers. The method also includes laminating and electrically joining a circuitized liquid crystal polymer (LCP) substrate to the interconnect layer stack on a side thereof opposite the sacrificial substrate, and removing the sacrificial substrate to expose a lowermost patterned electrical conductor layer. The method further includes electrically coupling at least one first device to the lowermost patterned electrical conductor layer. This method advantageously allows the formation of an electronic device on an interconnect layer stack that would be difficult to form on a circuitized LCP substrate.

Laminating the LCP substrate and the interconnect layer stack together may comprise applying heat and pressure to the LCP substrate and the interconnect layer stack. The heat and pressure may be applied in an autoclave.

Forming the interconnect layer stack may be performed by forming the plurality of patterned electrical conductor layers by thin film deposition. In addition, The LCP substrate may be relatively thin, that is, it may have a thickness of less than 0.0025 inches. Further, the at least one first device may include a first integrated circuit (IC) die in a flip chip arrangement.

At least one electrical conductor via may be formed in the LCP substrate. At least one second device may be connected to the LCP substrate, and the at least one second device may be electrically coupled to the uppermost patterned electrical conductor layer using the at least one electrical conductor via.

The sacrificial substrate may be glass or any atomically smooth material. The LCP substrate may have at least one electrical conductor via therein, and the method may also include forming an other interconnect layer stack on an other sacrificial substrate and comprising a plurality of patterned electrical conductor layers, and a dielectric layer between adjacent patterned electrical conductor layers. The other interconnect layer stack may be laminated and electrically joined to the LCP substrate on a side thereof opposite the other sacrificial substrate.

The other sacrificial substrate may be removed to expose a lowermost patterned electrical conductor layer. The method may further include electrically coupling at least one other device to the lowermost patterned electrical conductor layer, and electrically coupling the interconnect layer stack and the other interconnect layer stack together.

In some applications, the LCP substrate may have an area greater than an area of the sacrificial substrate, and at least one other LCP substrate having an aperture therein aligned with the at least one first device may be laminated to the LCP substrate.

At least one electrical conductor via may be formed in the at least one additional LCP substrate. An other interconnect layer stack may be formed on an other sacrificial substrate and comprising a plurality of patterned electrical conductor layers, and a dielectric layer between adjacent patterned electrical conductor layers. The other interconnect layer stack may be laminated and electrically joined to an other LCP substrate on a side thereof opposite the other sacrificial substrate, and the other sacrificial substrate may be removed to expose a lowermost patterned electrical conductor layer.

At least one other device may be electrically coupled to the lowermost patterned electrical conductor layer. The other LCP substrate may be laminated to the at least one additional LCP substrate. The interconnect layer stack and the other interconnect layer stack may be electrically coupled using the at least one electrical conductor via in the at least one additional LCP substrate.

The LCP substrate may comprise at least one conductor via in each of a plurality of LCP layers, and which may comprise aligning, laminating, and electrically joining the LCP substrate to the interconnect layer stack. Remaining LCP layers of the plurality thereof may be laminated to the LCP layer that was laminated to the interconnect stack. At least one second device may be electrically coupled to the uppermost patterned electrical conductor layer using the at least one electrical conductor via of each of the plurality of LCP layers.

A device aspect is directed to an electronic device comprising a liquid crystal polymer (LCP) substrate. There is a an interconnect layer stack on the LCP substrate comprising a plurality of patterned electrical conductor layers, and a dielectric layer between adjacent patterned electrical conductor layers, the dielectric layer comprising a material different than LCP. There is a fused seam between the LCP substrate and the interconnect layer stack. In addition, there is an electrical interconnection between the LCP substrate and the attached interconnect layer stack. At least one first device is electrically coupled to a lowermost patterned electrical conductor layer.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
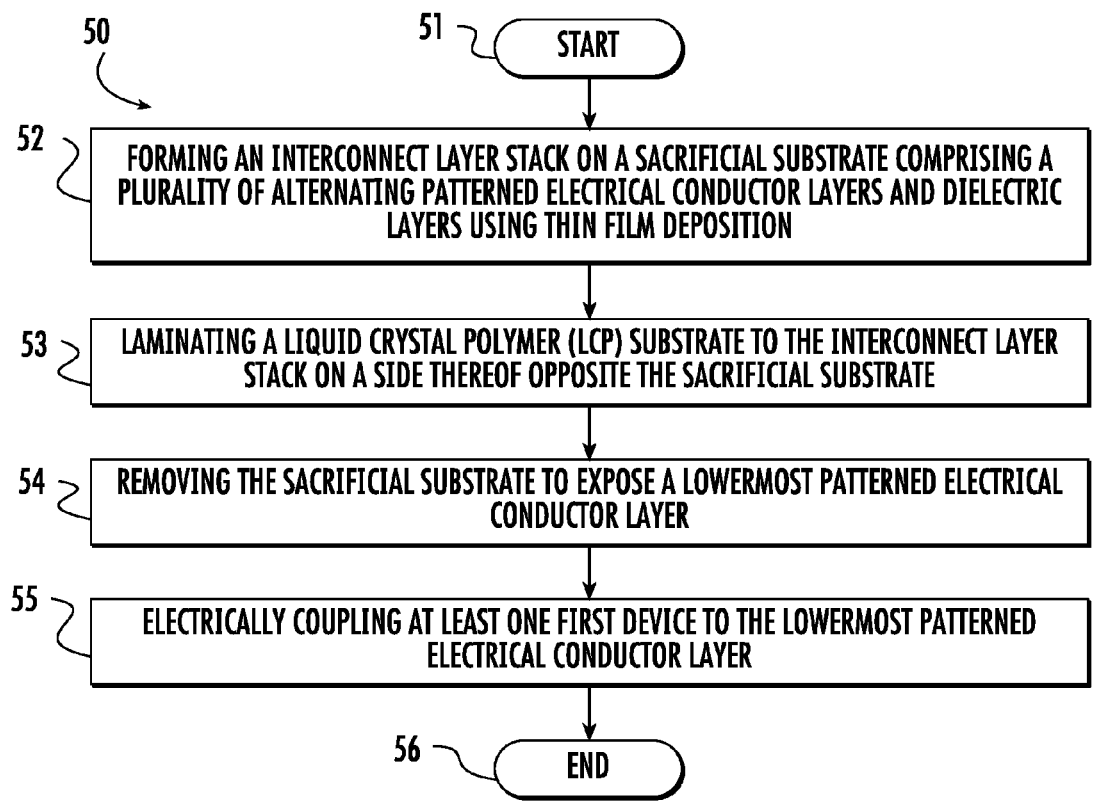
FIG. 1 is a flowchart of a method of making an electronic device according to the present invention.
Figure 2A:
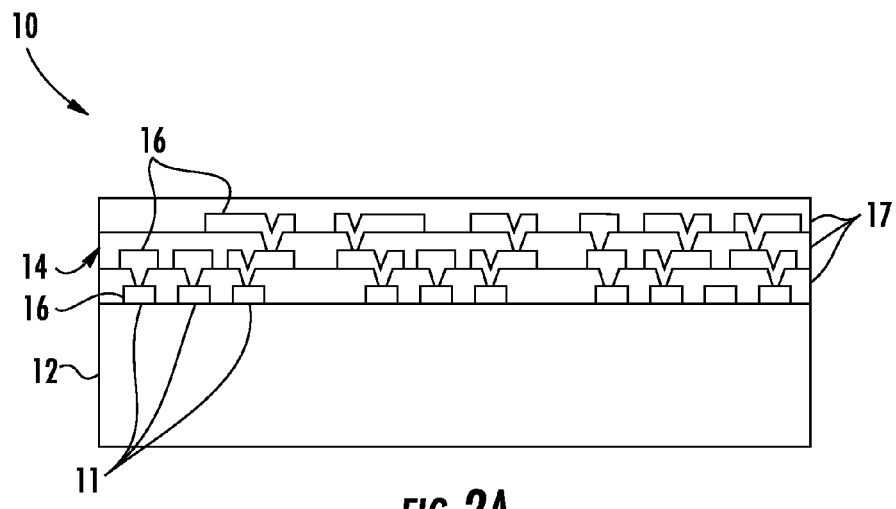
FIGS. 2A-2D are sequential schematic cross sectional views of an electronic device of the present invention as formed via the method shown in FIG. 1

Referring initially to the flowchart 50 of FIG. 1, and FIGS. 2A-2D, a method of making an electronic device is now described. After the start (Block 51), as shown in FIG. 2A, an interconnect layer stack 14 is formed on a sacrificial substrate 12 (at Block 52). The interconnect layer stack 14 comprises a plurality of alternating patterned electrical conductor layers 16, with dielectric layers 17 between adjacent patterned electrical conductor layers. The dielectric layer 17 may be polyimide. The sacrificial substrate 12 provides dimensional stability and atomic smoothness for formation of the interconnect layer stack 14.

The interconnect layer stack 14 may be thinner than 0.0004 inches, for example, with patterned electrical conductor layers 16 as small as (or even smaller than) 0.00004 inches, and dielectric layers 17 as small as (or smaller than) 0.00016 inches. The sacrificial substrate 12 is preferably glass, although other materials with a sufficiently smooth surface may also be used. The interconnect layer stack 14, and therefore the plurality of patterned electrical conductor layers 16, may be formed by semiconductor thin film deposition processes.

Figure 2B:
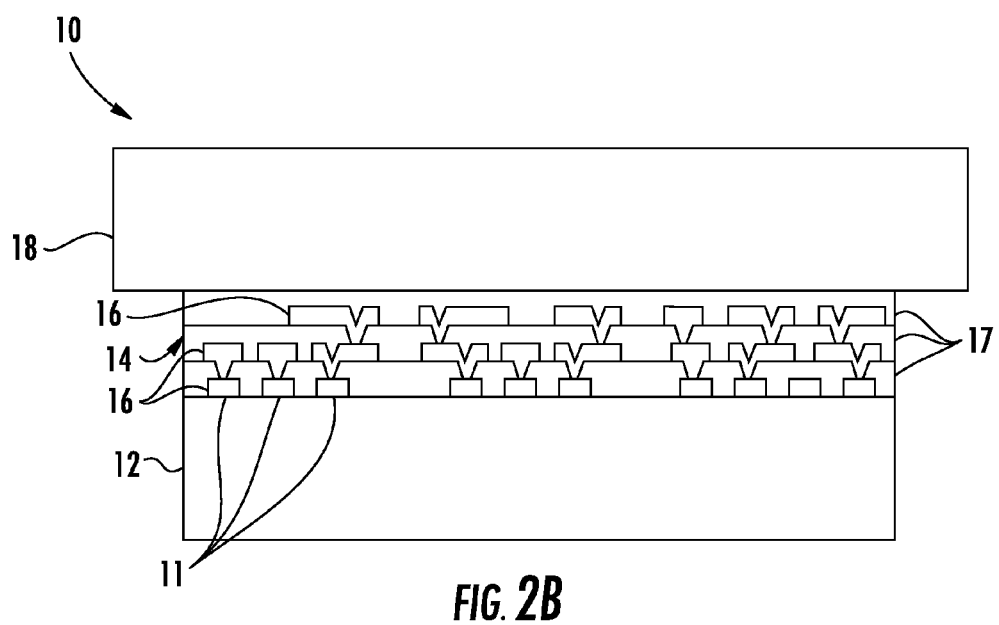

As shown in FIG. 2B, a liquid crystal polymer (LCP) substrate 18 is laminated to the interconnect layer stack 14 on a side thereof opposite the sacrificial substrate 12 (at Block 53). The LCP substrate 18 may have a thickness of less than 0.0025 inches, for example. This lamination is performed via the application of heat and pressure to the LCP substrate 18 and the interconnect layer stack 14, such as in an autoclave. An autoclave advantageously provides isostatic pressure (i.e. equal pressure from all directions), and helps to keep the LCP from deforming during the lamination process. While the use of an autoclave for lamination is preferred, a press (possibly in an inert atmosphere) may also be used to perform the lamination. The lamination is preferably performed at approximately 260° C. and 100 psi.

LCP is a particularly advantageous material from which to form printed circuit boards for a variety of reasons, including the fact that it has a high tensile strength, providing a high resistance to abrasion and damage. Typically, LCP also has a high mechanical strength at high temperatures, high chemical resistance, inherent flame retardancy, and good weatherability. In addition, LCP is relatively inert. LCP resists stress cracking in the presence of most chemicals at elevated temperatures, including aromatic or halogenated hydrocarbons, strong acids, bases, ketones, and other aggressive industrial substances. Those skilled in the art should understand that there are a variety of LCPs that may be used in the production of electronic devices according to the present invention. The use of LCP as the substrate 18 advantageously allows the lamination without an adhesive layer, thereby reducing the overall thickness of the resulting electronic device 10.

Figure 2C:
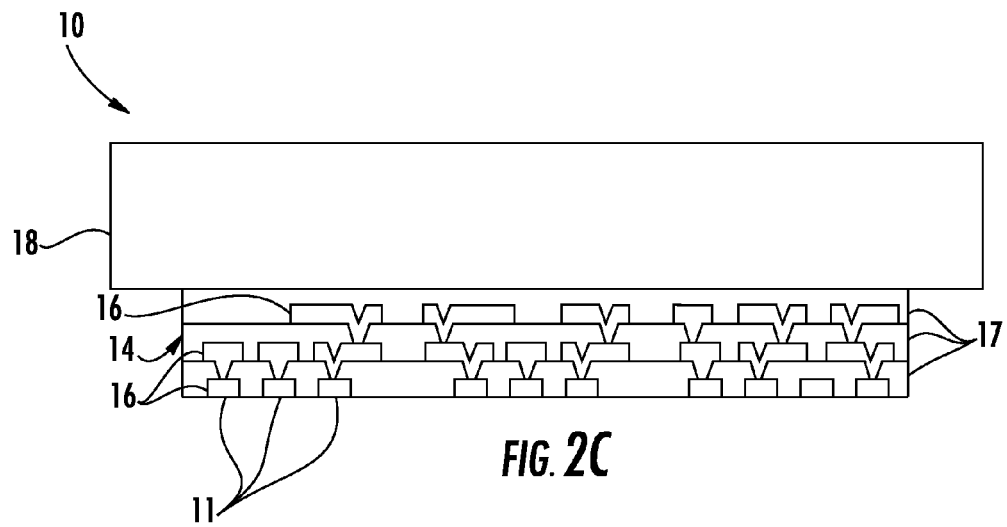

Next, as shown in FIG. 2C, the sacrificial substrate 12 is removed, thereby exposing a lowermost patterned electrical conductor layer 16 (Block 54). This sacrificial substrate 12 removal is performed by dissolution in hydrofluoric acid, mechanical polishing, or a combination of chemical mechanical polishing, for example.

Figure 2D:
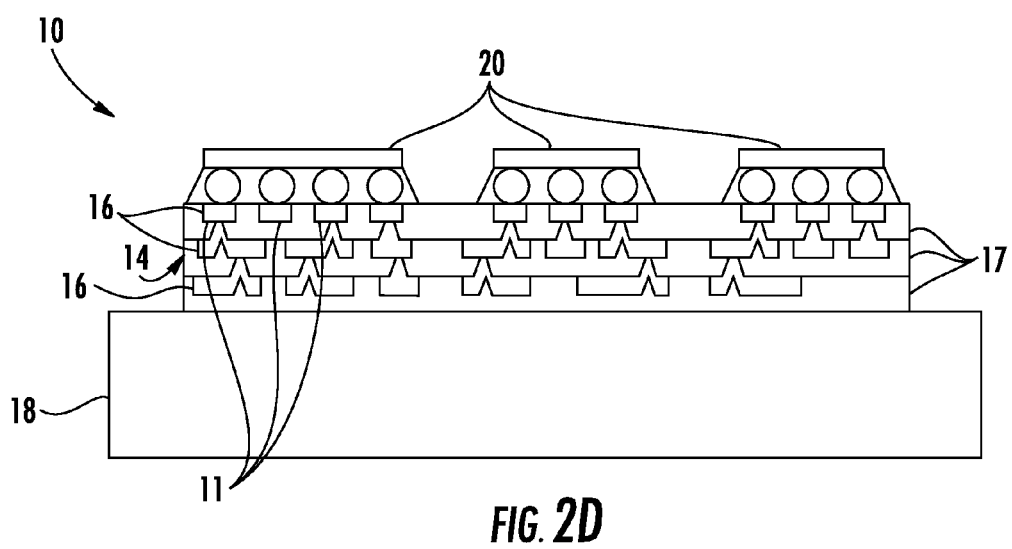
Figure 3:
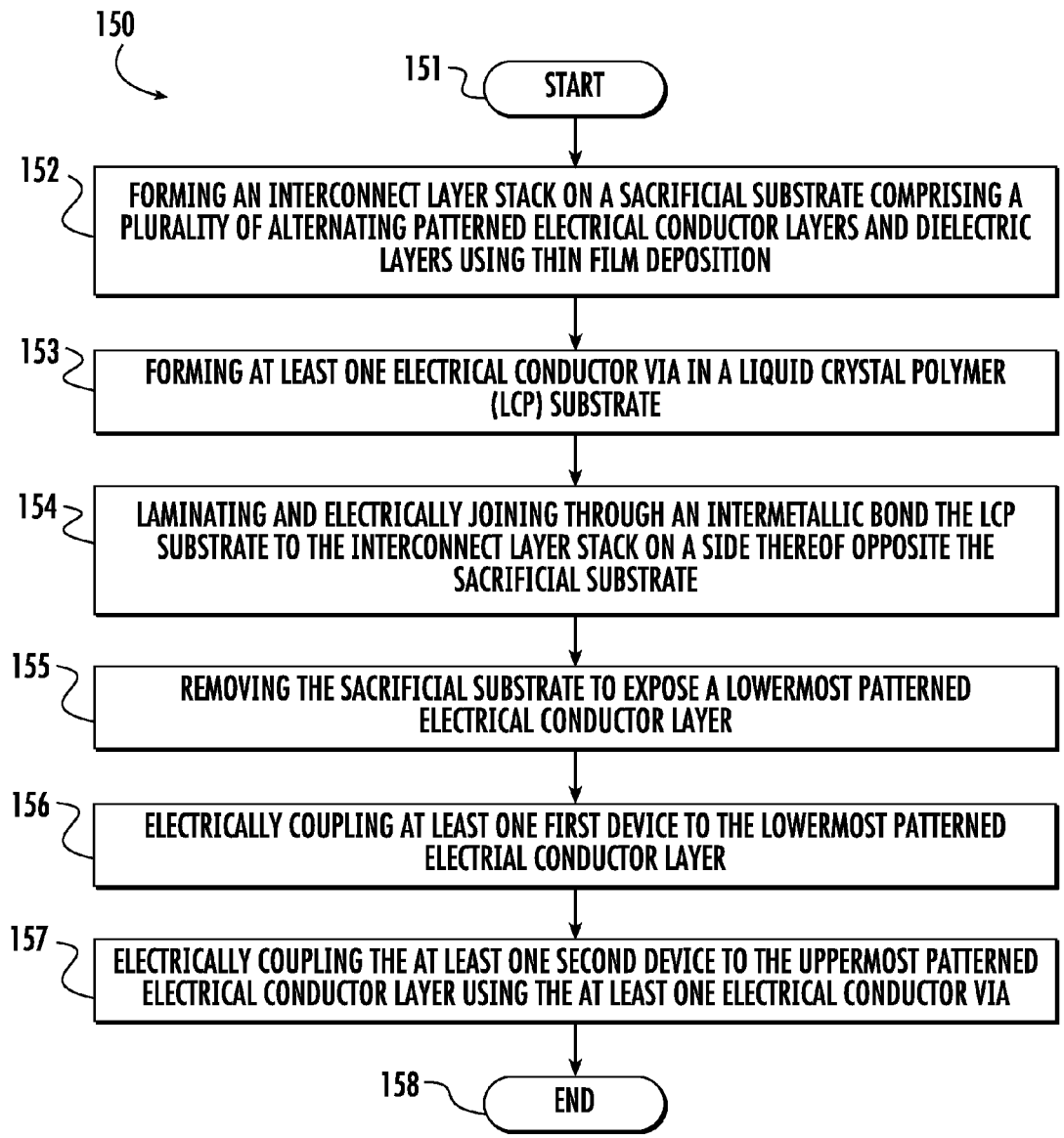
FIG. 3 is a flowchart of another embodiment of a method of making an electronic device according to the present invention.

At least one first device 20 (illustratively three devices) is coupled to the lowermost patterned electrical conductor layer 16 (Block 55), as shown in FIG. 2D. This device 20 may be an integrated circuit (IC) die, and may be coupled in a flip chip arrangement, as will be appreciated by those skilled in the art. Block 56 indicates the end of the method.

The method therefore results in an electronic device 10 comprising an LCP substrate 18 with an interconnect layer stack 14 formed thereon. The interconnect layer stack 14 comprises a plurality of patterned electrical conductor layers 16, with dielectric layers 17 between adjacent patterned electrical conductor layers. There is a fused seam between the interconnect layer stack 14 and the LCP substrate 18. This fused seam is formed during the softening and joining of the LCP substrate and the interconnect layer stack 14, and is readily visible in a photograph of a cross sectioned device. Three integrated circuit dies 20 are coupled to the lowermost patterned electrical conductor layer 16 in a flip chip arrangement. It should be appreciated that there may instead be any number of devices 20, and that they need not be integrated circuit dies.

With reference to flowchart 150 of FIG. 3 and FIGS. 4A-4E, a further embodiment of the method of making an electronic device 110 according to the present invention is now described. It should be understood that steps in this method are performed similar to those in the flowchart 50 of FIG. 1, and that detailed descriptions of those steps are therefore not necessary.

Figure 4A:
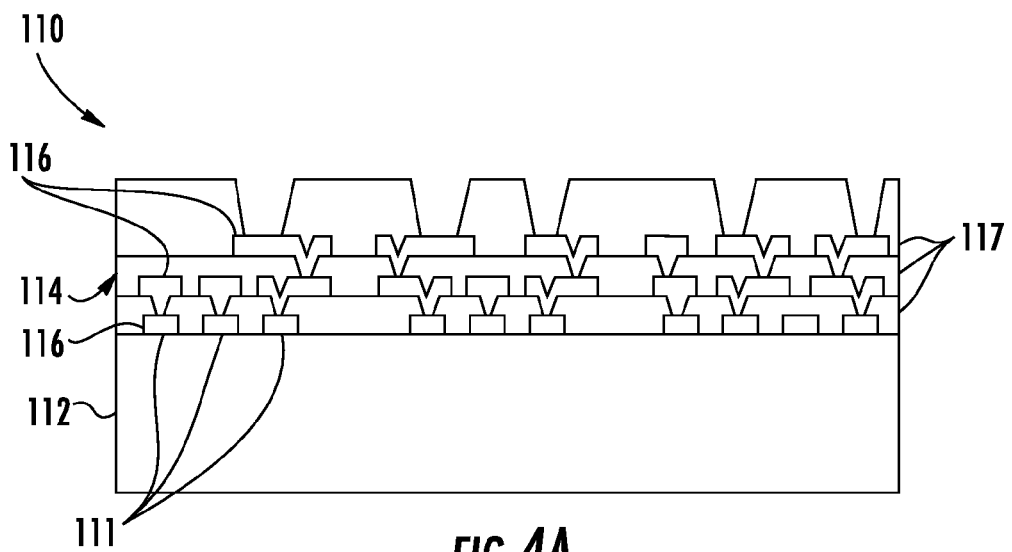
FIGS. 4A-4E are sequential schematic cross sectional views of an electronic device of the present invention as formed via the method shown in FIG. 3.

After the start (Block 151), as shown in FIG. 4A, an interconnect layer stack 114 is formed on a sacrificial substrate 112 using thin film deposition (at Block 152). The interconnect layer stack 114 comprises a plurality of patterned electrical conductor layers 116, and a dielectric layer 117 between adjacent patterned electrical conductor layers. Apertures are defined in the uppermost dielectric layer 117 such that pads of the uppermost patterned electrical conductor layer 116 are exposed by the apertures.

Figure 4B:
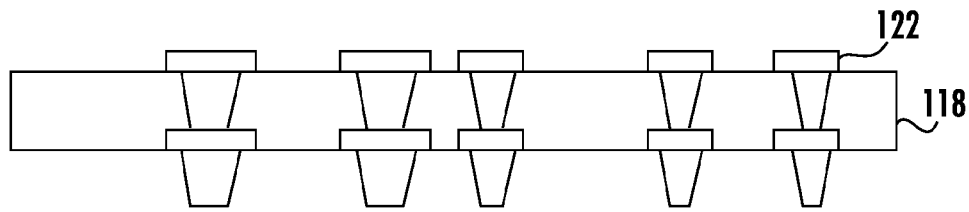

Next, at least one electrical conductor via 122, illustratively a plurality of electrical conductor vias, is formed in an LCP substrate 118 (Block 153), as shown in FIG. 4B. The electrical conductor vias 122 are formed by mechanical or laser drilling the LCP substrate 118, then selectively depositing copper in the resulting holes. Tin is then deposited on a lowermost layer of the electrical conductor vias 122.

Before lamination, the LCP substrate 118 and the interconnect layer stack 114 may be aligned. Alignment is defined as having the electrical conductive vias 122 centered in the pads of the uppermost patterned electrical conductor layer 116. This alignment may be performed by first using a fixture or guide to roughly align the LCP substrate 118 and the interconnect layer stack 114, and then finely adjusting the alignment under a microscope to reach the final alignment. This advantageously allows a positional accuracy of alignment in the range of 0.0005 inches to 0.001 inches.

Figure 4C:
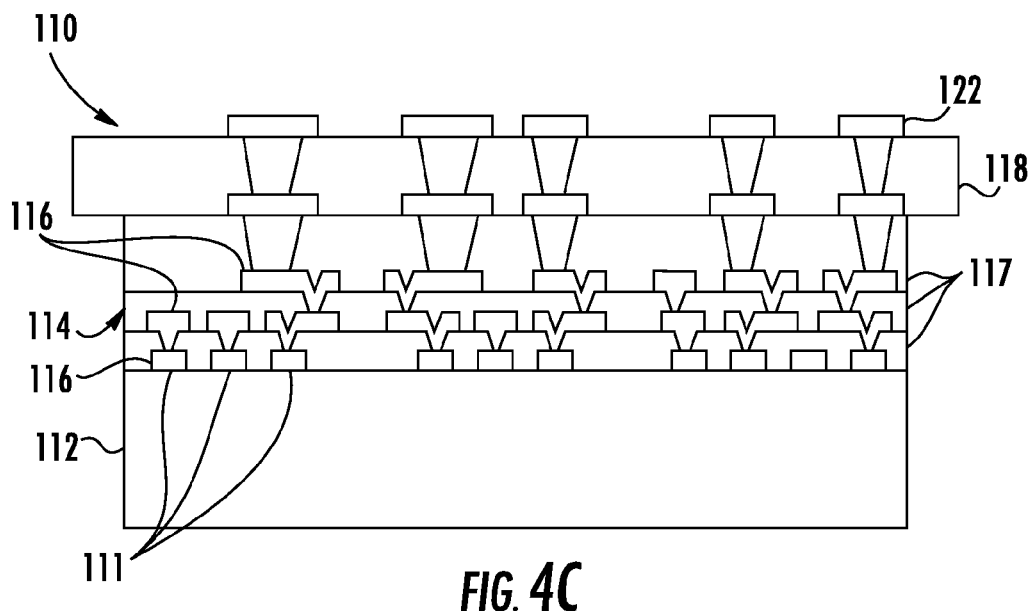

The LCP substrate 118 is then laminated and electrically joined to the interconnect layer stack 114 on a side thereof opposite the sacrificial substrate 112 (Block 154), as shown in FIG. 4C. During the lamination process step, the temperature reaches a suitable level, such as 260° C., which is the melting point of tin, and at which point the copper and tin diffuse and react to form an intermetallic compound, such as $Cu_3Sn$. This intermetallic compound, which is responsible for establishing electrical connection between the LCP substrate and the interconnect layer stack, is thermally stable up to its melting point of at least 600° C. Advantageously, the temperature required for successful lamination and intermetallic compound formation fall within the same range.

Figure 4D:
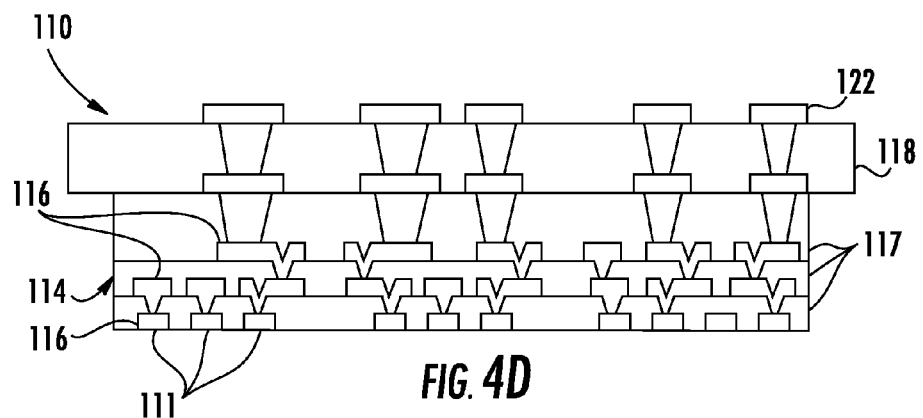
Figure 4E:
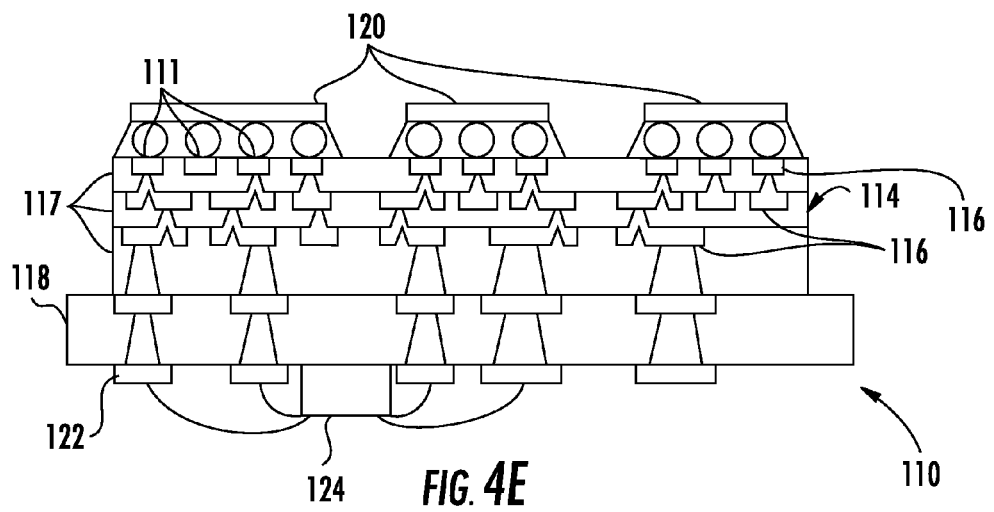
Figure 5:
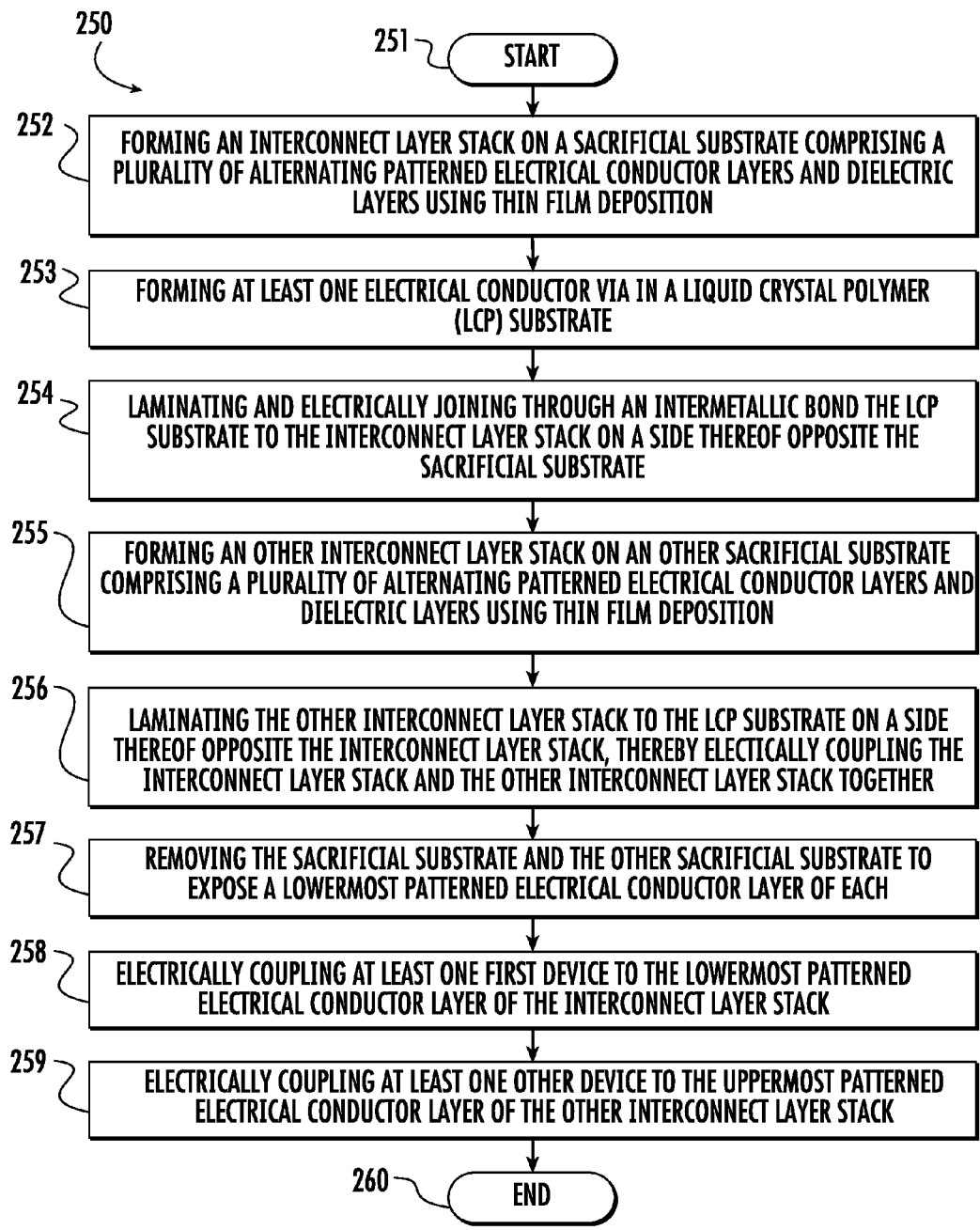
FIG. 5 is a flowchart of a further embodiment of a method of making an electronic device according to the present invention.

The sacrificial substrate 112 is then removed to expose a lowermost patterned electrical conductor layer 116 (Block 155), as shown in FIG. 4D. At least one first device 120, illustratively a trio thereof, is electrically coupled to the lowermost patterned electrical conductor layer 116 (Block 156), as shown in FIG. 4E. The trio of devices 120 may be integrated circuit dies in a flip chip arrangement, but may also be other devices. At least one second device 124 is electrically coupled to the uppermost patterned electrical conductor layer 116 of the interconnect layer stack 114 using the electrical conductor via 122 (Block 157). This provides connectivity between the devices 120, 124.

It should be appreciated that the devices 120, 124 may be different kinds of devices. For example, the devices 120 may be digital logic circuits, while the devices 124 may be analog radiofrequency circuits. Block 158 indicates the end of the method.

This method therefore results in an electronic device 110 comprising a LCP substrate 118 with a plurality of conductor vias 122 formed therein. An interconnect layer stack 114 is formed on the LCP substrate 118. The interconnect layer stack 114 comprises a plurality of patterned electrical conductor layers 116, with dielectric layers 117 between adjacent patterned electrical conductor layers. There is a fused seam between the interconnect layer stack 114 and the LCP substrate 118. Three integrated circuit dies 120 are coupled to the lowermost patterned electrical conductor layer 116 in a flip chip arrangement. A radiofrequency device 124 is electrically coupled to the uppermost patterned electrical conductor layer 116 and electrically coupled to the integrated circuit dies 120 via the electrical conductor vias 122.

With reference to flowchart 250 of FIG. 5 and FIGS. 6A-6E, a further embodiment of the method of making an electronic device 210 according to the present invention is now described. It should be understood that steps in this method are performed similar to those in the flowcharts 50 and 150 of FIGS. 1 and 3, and that detailed descriptions of those steps are therefore not necessary.

After the start (Block 251), as shown in FIG. 5A, an interconnect layer stack 214 is formed on a sacrificial substrate 212 using thin film deposition (at Block 252). The interconnect layer stack 214 comprises a plurality of patterned electrical conductor layers 216, and a dielectric layer 217 between adjacent patterned electrical conductor layers. Apertures are defined in the uppermost dielectric layer 217 such that pads of the uppermost patterned electrical conductor layer 216 are exposed by the apertures.

Next, at least one electrical conductor via 222, illustratively a plurality of electrical conductor vias, is formed in a LCP substrate 218 (Block 253), as shown in FIG. 5B. The LCP substrate 218 is laminated and electrically joined through an intermetallic bond to the interconnect layer stack 214 on a side thereof opposite the sacrificial substrate 212 (Block 254), as shown in FIG. 6C.

Figure 6A:
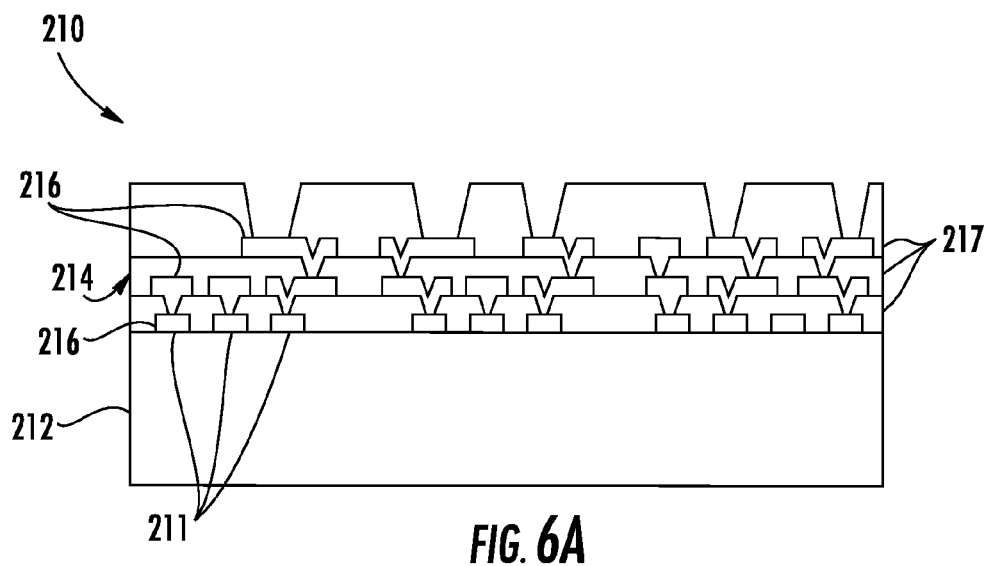
FIGS. 6A-6E are sequential schematic cross sectional views of an electronic device of the present invention as formed via the method shown in FIG. 5.
Figure 6B:
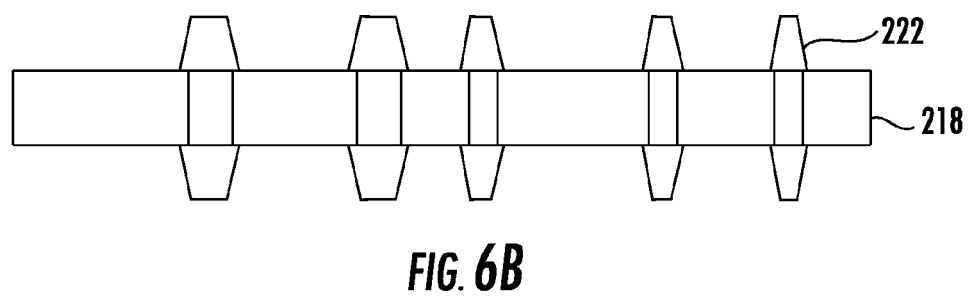
Figure 6C:
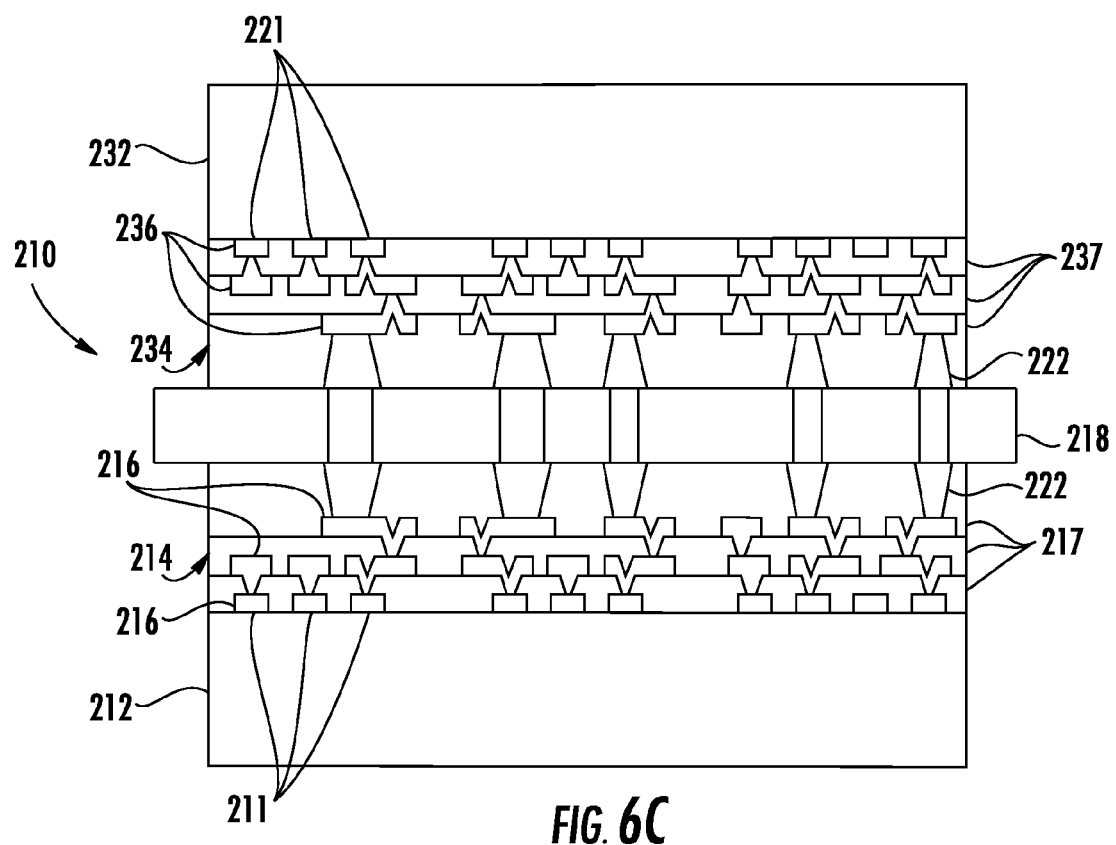
Figure 6D:
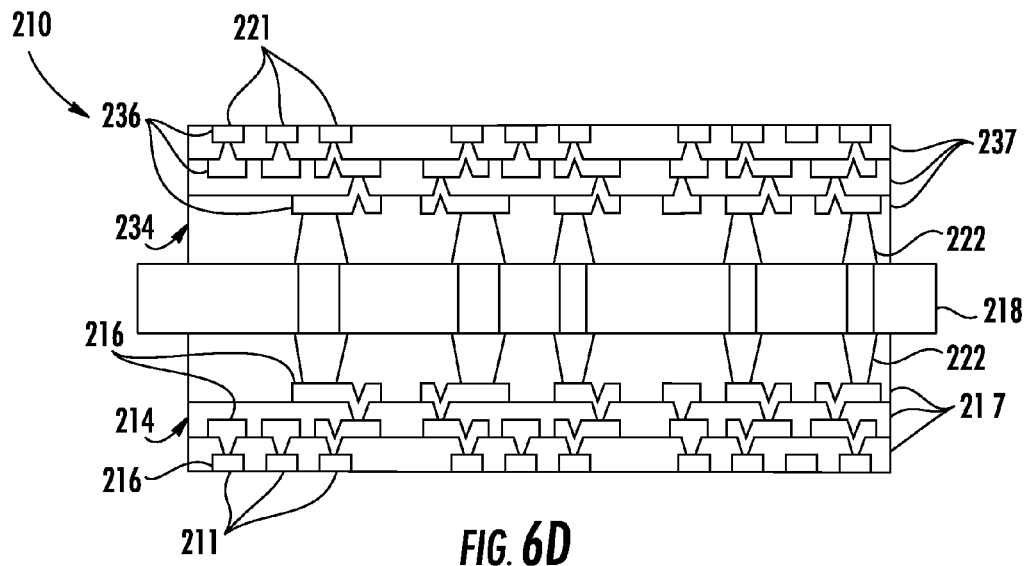

An other interconnect layer stack 234 is formed on an other sacrificial substrate 232 (Block 255), as shown in FIG. 6C. This other interconnect layer stack 234 likewise comprises a plurality of patterned electrical conductor layers 236 and a dielectric layer 237 between adjacent patterned electrical conductor layers. This other interconnect layer stack 235 is then laminated and electrically coupled to the LCP substrate 218 on a side thereof opposite the interconnect layer stack 214 (Block 256), thereby electrically coupling the interconnect layer stack and the other interconnect layer stack together. Both sacrificial substrates 212, 232 are then removed to expose the lowermost patterned electrical conductor layers 216, 236 of the interconnect layer stack 214 and interconnect layer stack 234, respectively (Block 257), as shown in FIG. 6D.

Figure 6E:
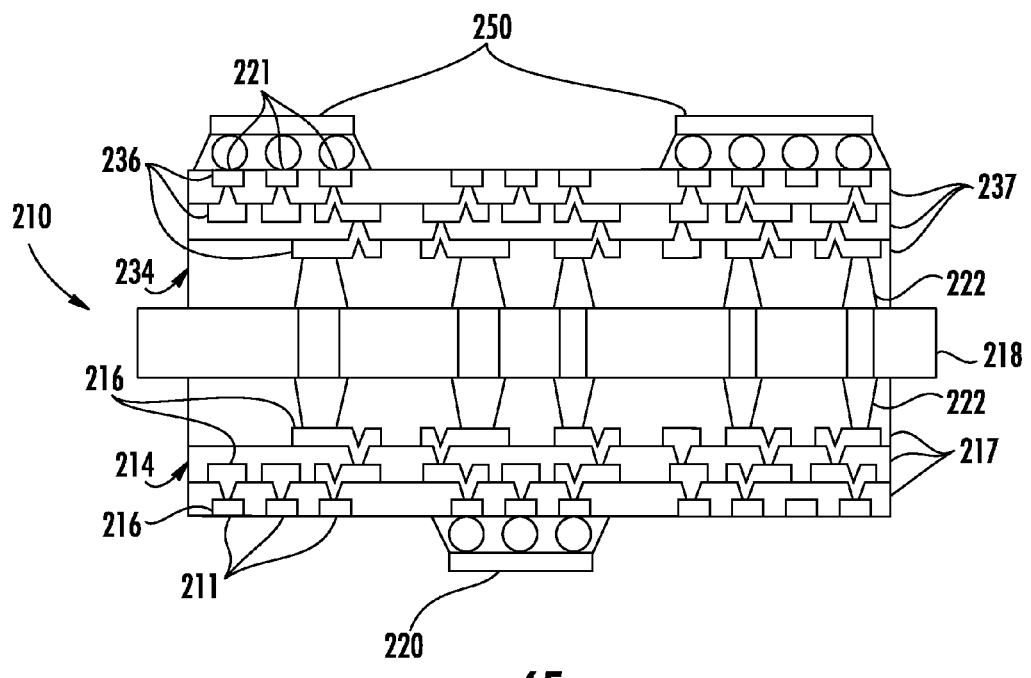
Figure 7:
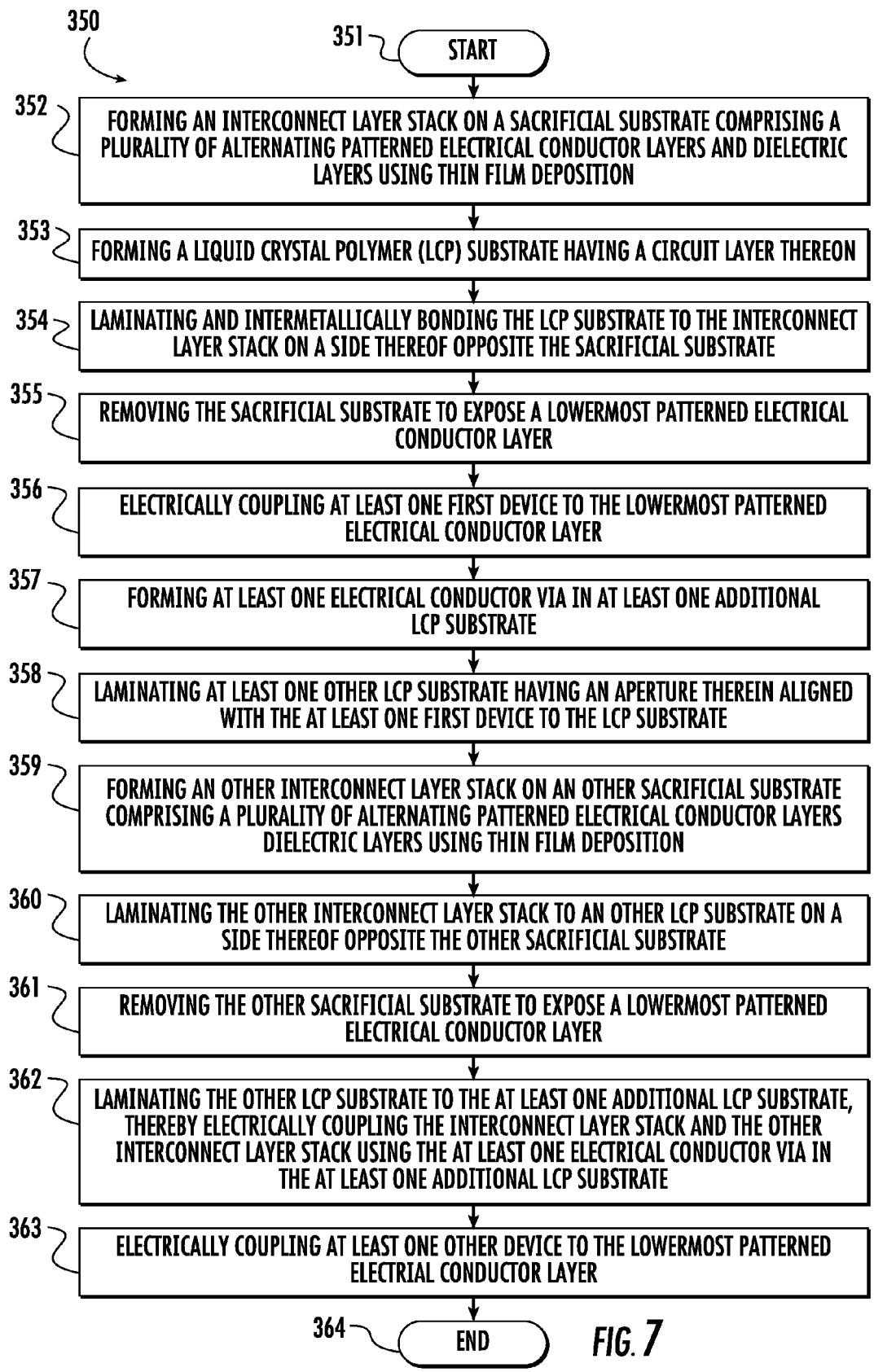
FIG. 7 is a flowchart of a yet another embodiment of a method of making an electronic device according to the present invention.

At least one first device 220 is electrically coupled to the lowermost patterned electrical conductor layer 216 of the interconnect layer stack 214 (Block 258), as shown in FIG. 6E. At least one other device 250, illustratively two devices, is then electrically coupled to the uppermost patterned electrical conductor layer 236 of the interconnect layer stack 234 (Block 259).

This method therefore results in an electronic device 210 comprising an LCP substrate 218 with a plurality of conductor vias 222 formed therein, as shown in FIG. 6E. An interconnect layer stack 214 and an other interconnect layer stack 234 are formed on opposing sides of the LCP substrate 218. The interconnect layer stacks 214, 234 each comprise a plurality of patterned electrical conductor layers 216, 236 with dielectric layers 217, 237 between adjacent patterned electrical conductor layers. There is a fused seam between each interconnect layer stack 214, 234 and the LCP substrate 218. An integrated circuit die 220 is coupled to the lowermost patterned electrical conductor layer 216 in a flip chip arrangement. A pair of integrated circuit dies 250 are electrically coupled to the uppermost patterned electrical conductor layer 236 and electrically coupled to the integrated circuit die 220 via the electrical conductor vias 222.

With reference to flowchart 350 of FIG. 7 and FIGS. 8A-8E, a further embodiment of the method of making an electronic device 310 according to the present invention is now described. It should be understood that steps in this method are performed similar to those in the flowcharts 50, 150, 250 of FIGS. 1, 3, 5 and that detailed descriptions of those steps are therefore not necessary.

Figure 8A:
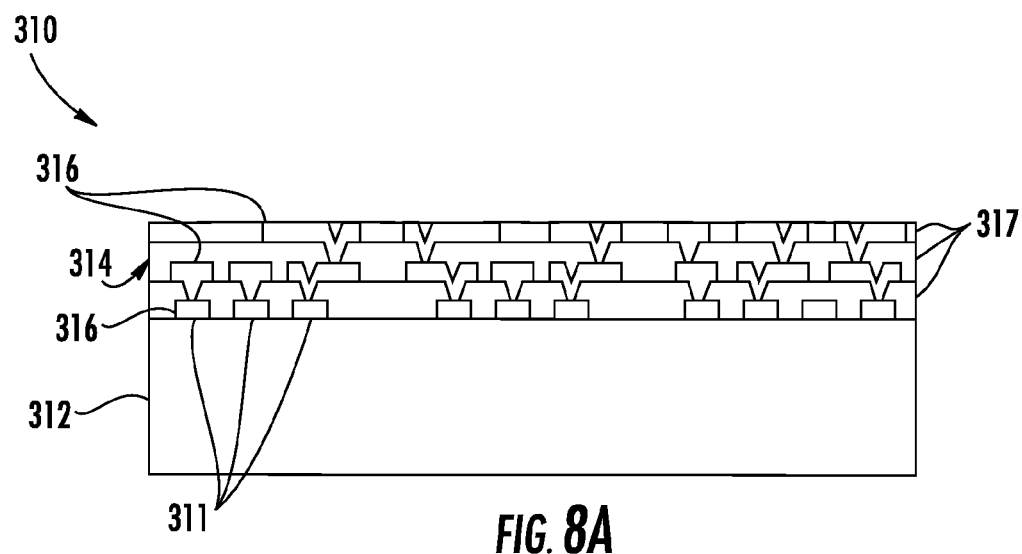
FIGS. 8A-8E are sequential schematic cross sectional views of an electronic device of the present invention as formed via the method shown in FIG. 7.

After the start (Block 351), as shown in FIG. 8A, an interconnect layer stack 314 is formed on a sacrificial substrate 312 using thin film deposition (at Block 352). The interconnect layer stack 314 comprises a plurality of patterned electrical conductor layers 316, and a dielectric layer 317 between adjacent patterned electrical conductor layers. The uppermost patterned electrical conductor layer 316 is exposed.

Figure 8B:
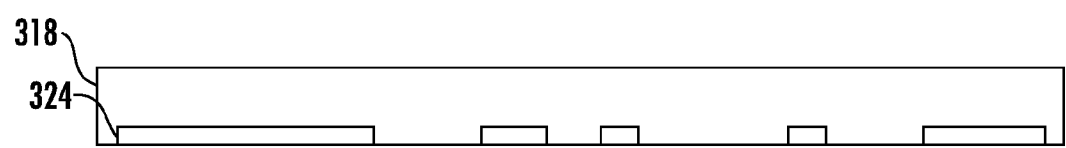

A liquid crystal polymer (LCP) substrate 318 is formed (Block 353), as shown in FIG. 8B. Copper features are selectively patterned on the LCP substrate 318, and tin is then selectively deposited on the copper to thereby form a circuit layer 324.

Figure 8C:
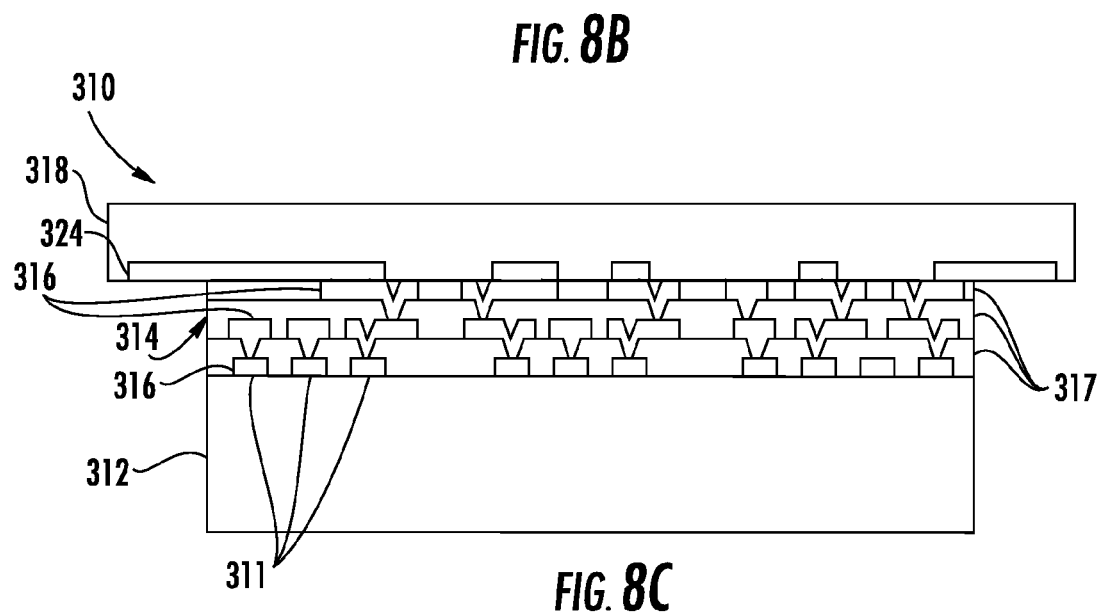

The LCP substrate 318 is laminated and the tin coated copper features of the LCP substrate 318 are intermetallically bonded to the interconnect layer stack 314 on a side thereof opposite the sacrificial substrate 312 (Block 354), as shown in FIG. 8C. The lamination is preferably performed at 290° C. and 100 psi, although of course other temperatures and pressure could be used.

Figure 8D:
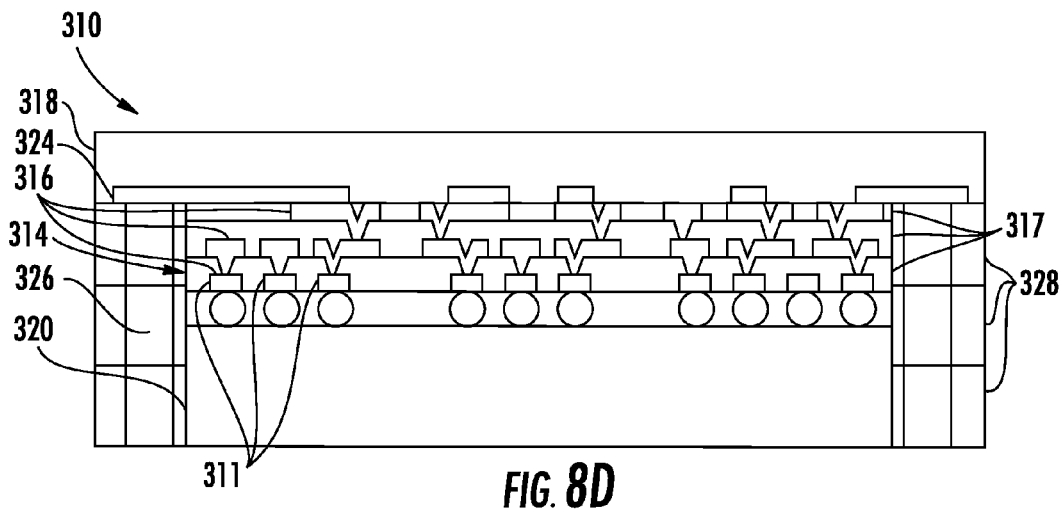

The sacrificial substrate 312 is removed to expose a lowermost patterned electrical conductor layer 316 (Block 355). At least one first device 320 is electrically coupled to the lowermost patterned electrical conductor layer 316 (Block 356), as shown in FIG. 8D.

At least one electrical conductor via 326 is formed in at least one additional LCP substrate 328, illustratively three additional LCP substrates (Block 357). The additional LCP substrates 328 have an aperture therein aligned with the device 320 which is formed by laser milling or mechanical punching. The additional LCP substrates 328 are laminated to the LCP substrate 318 (Block 358), preferably at 270° C. and at 200 psi, although other temperatures and pressures may be used.

An other interconnect layer stack 334 is formed on another sacrificial substrate 350. This other interconnect layer stack 334 also comprises a plurality of patterned electrical conductor layers 336 and a dielectric layer 337 between adjacent patterned electrical conductor layers (Block 359). The other interconnect layer stack 334 is then laminated to and intermetallically bonded with an other LCP substrate 338 (Block 360), which has had a circuit layer 344 formed thereon. The sacrificial substrate is then removed to expose the lowermost patterned electrical conductor layer 336 (Block 361).

The other LCP substrate 338 is then laminated (Block 362) to the bottommost additional LCP substrate 328, thereby electrically coupling the interconnect layer stack 314 and the other interconnect layer stack 334 via the electrical conductor via 326, and the circuit layers 324, 344. This hermetically seals the device 320 from moisture, dust, and debris. At least one other device 350 is then coupled to the lowermost patterned electrical conductor layer (Block 363).

Figure 8E:
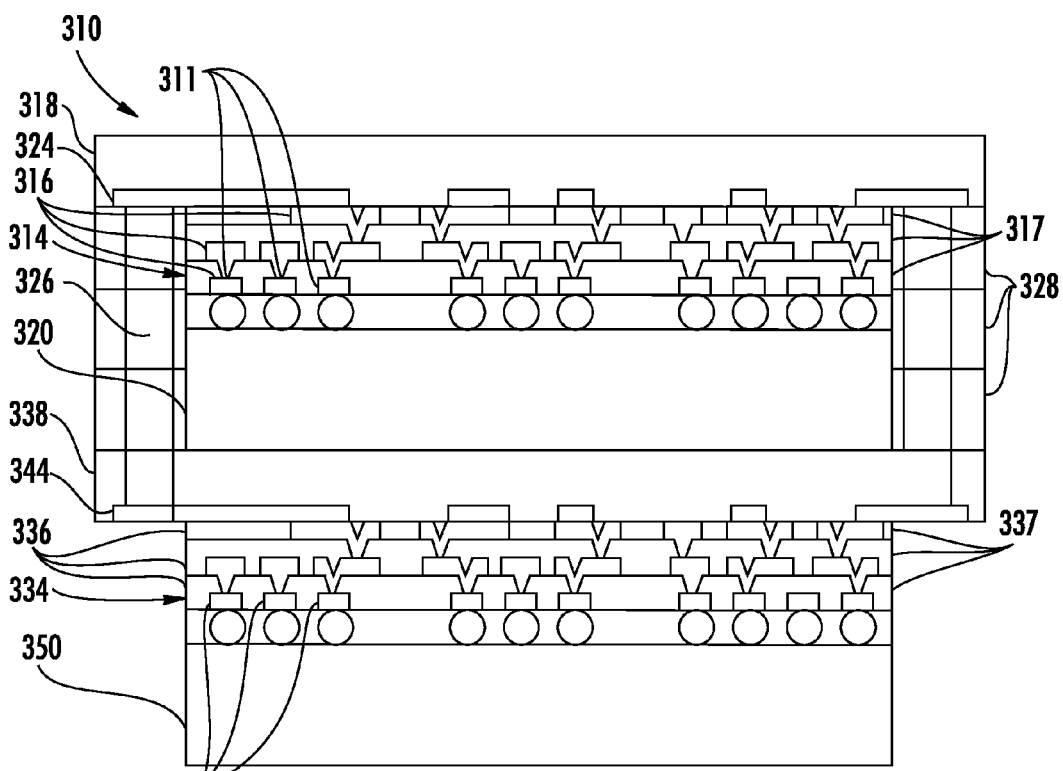
Figure 9:
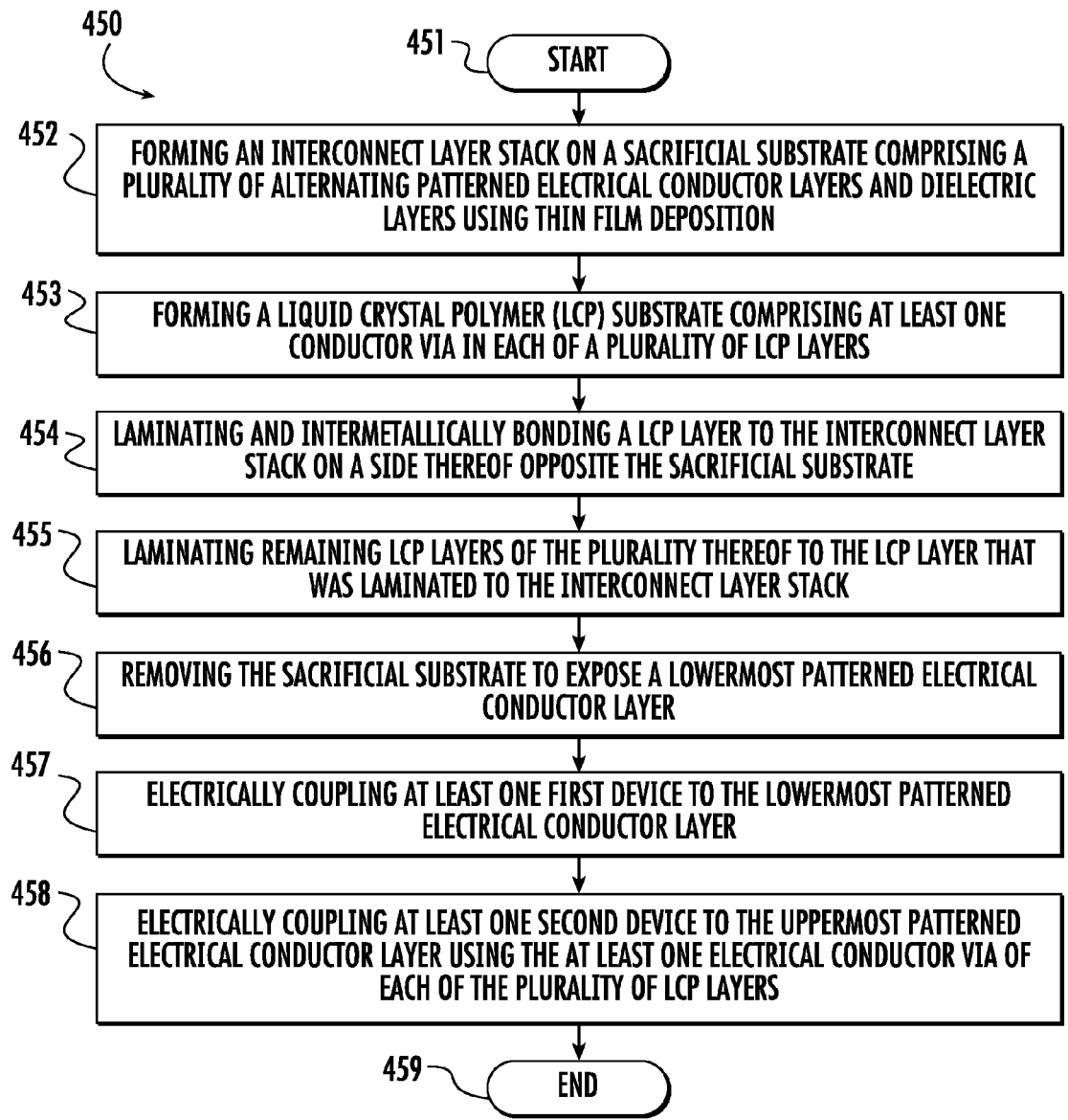
FIG. 9 is a flowchart of a still another embodiment of a method of making an electronic device according to the present invention.

This method therefore results in an electronic device 310 comprising a LCP substrate 318 with a circuit layer 324 formed thereon, as shown in FIG. 8E. An interconnect layer stack 314 is coupled with the LCP substrate 318. The interconnect layer stack 314 comprises a plurality of patterned electrical conductor layers 316 with a dielectric layer 317 between adjacent patterned electrical conductor layers. There is a fused seam between each the interconnect layer stack 314 and the LCP substrate 318. An integrated circuit die 320 is coupled to the lowermost patterned electrical conductor layer 316 in a flip chip arrangement.

Three additional LCP substrate layers 328 are laminated to the LCP substrate 318 on a same side as the interconnect layer stack 314 and have apertures defined therein that are aligned with the integrated circuit die 320. The LCP substrate layers 328 have electrical conductor vias 326 formed therein. There is a fused seam between each of the three additional LCP substrate layers 328, and between the topmost additional LCP substrate layer and the LCP substrate 318.

An other LCP substrate 338 is laminated to the bottommost additional LCP substrate layer 328, and there is a fused seam therebetween. An other interconnect layer stack 334 is laminated to the other LCP substrate 338, and there is also a fused seam therebetween. The other interconnect layer stack 334 comprises a plurality of patterned electrical conductor layers 336, with a dielectric layer 337 between adjacent patterned electrical conductor layers. An other integrated circuit die 350 is coupled to the lowermost patterned electrical conductor layer 336. Therefore, the integrated circuit die 320 and the other integrated circuit die 350 are electrically coupled via the circuit layers 324, 344 and the electrical conductor vias 326. The integrated circuit die 320 is therefore hermetically sealed by the surrounding LCP substrates 318, 328, 338.

With reference to flowchart 450 of FIG. 9 and FIGS. 10A-10E, a further embodiment of the method of making an electronic device 410 according to the present invention is now described. It should be understood that steps in this method are performed similar to those in the flowcharts 50, 150, 250, 350 of FIGS. 1, 3, 5, 7 and that detailed descriptions of those steps are therefore not necessary.

Figure 10A:
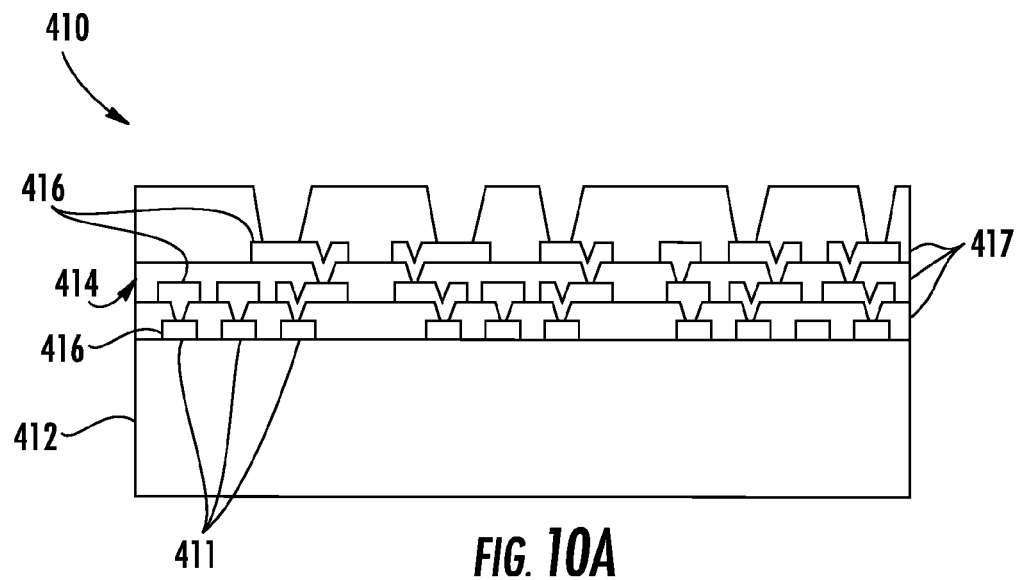
FIGS. 10A-10E are sequential schematic cross sectional views of an electronic device of the present invention as formed via the method shown in FIG. 9.

After the start (Block 451), as shown in FIG. 10A, an interconnect layer stack 414 is formed on a sacrificial substrate 412 using thin film deposition (at Block 452). The interconnect layer stack 414 comprises a plurality of patterned electrical conductor layers 416, and a dielectric layer 417 between adjacent patterned electrical conductor layers. Apertures are defined in the uppermost dielectric layer 417 such that pads of the uppermost patterned electrical conductor layer 416 are exposed by the apertures.

Figure 10B:
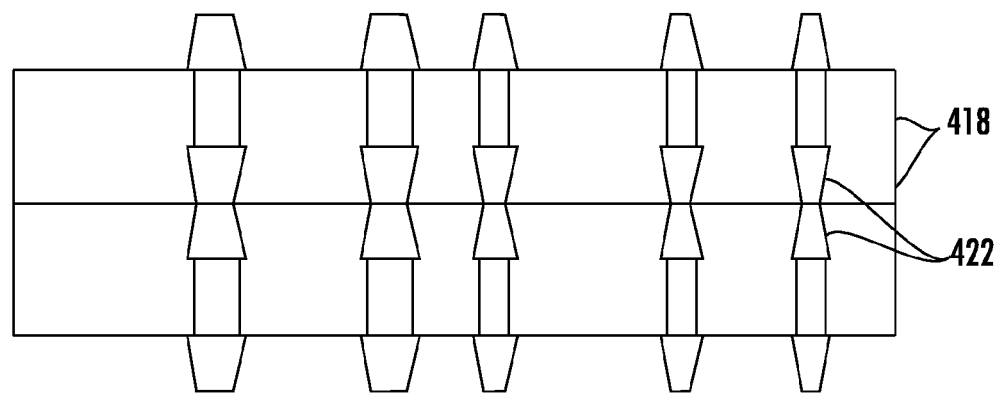

Next, at least one electrical conductor via 422, illustratively a plurality of electrical conductor vias, is formed in each of a plurality of LCP layers of a LCP substrate 418 (Block 453), as shown in FIG. 10B.

Figure 10C:
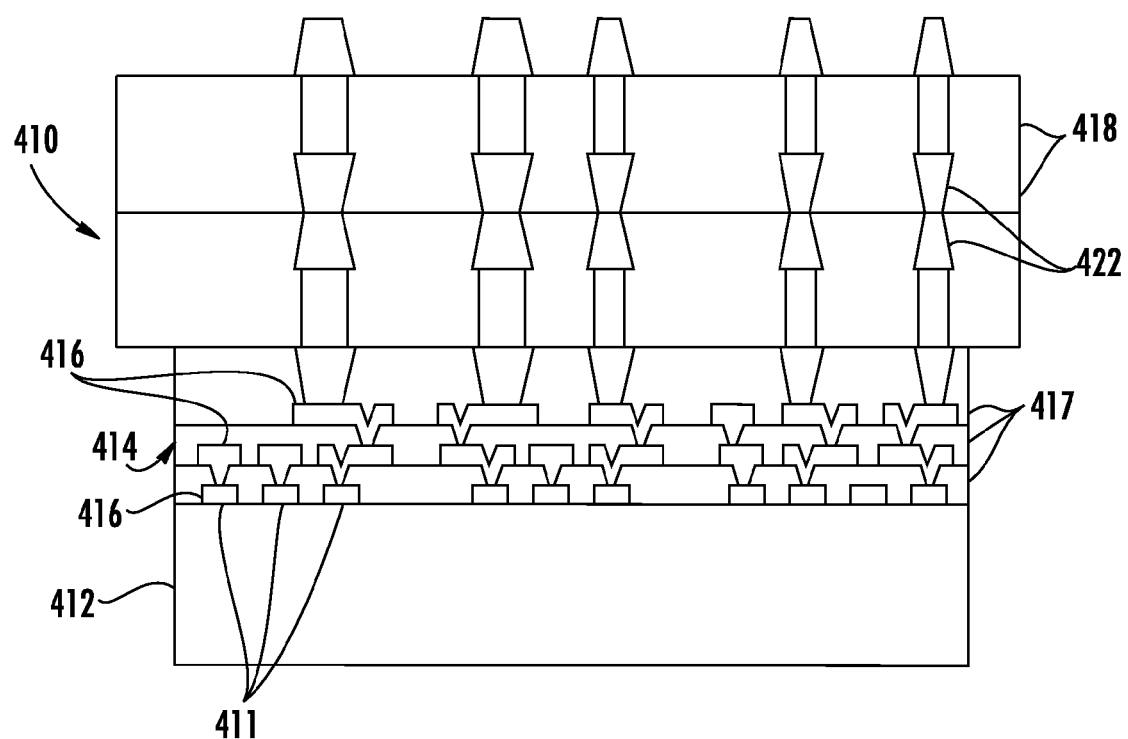

A layer 418 of the LCP substrate is laminated to the interconnect layer stack 414 on a side thereof opposite the sacrificial substrate 412 (Block 454), as shown in FIG. 10C. This bonding process also serves to intermetallically bond the vias 422 with the patterned electrical conductor layers 416. Before lamination, the LCP substrate 418 and the interconnect layer stack 414 may be aligned. Remaining LCP layers 418 are then laminated to the LCP layer that was laminated to the interconnect layer stack 414 (Block 455).

Figure 10D:
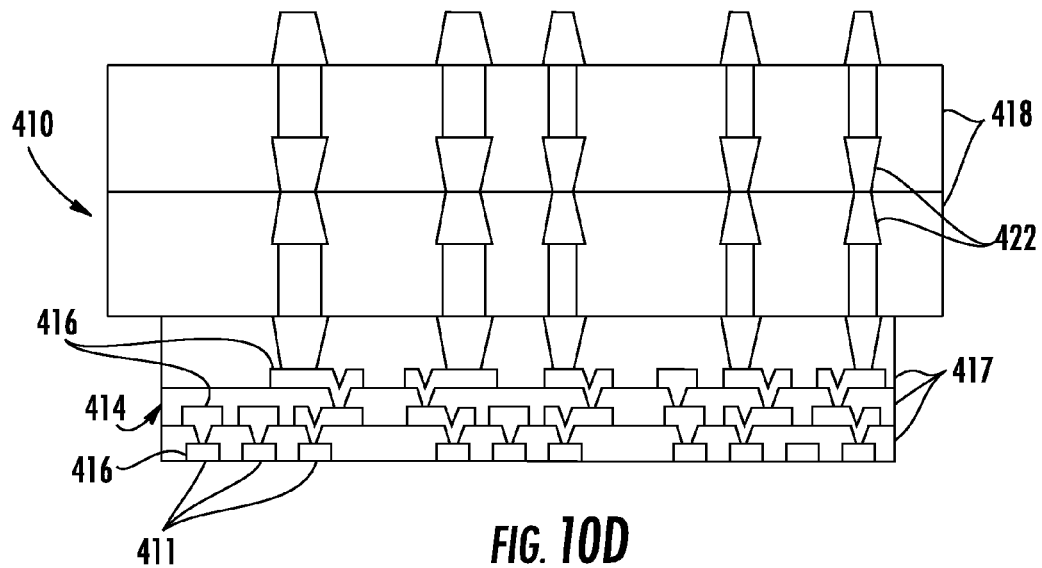
Figure 10E:
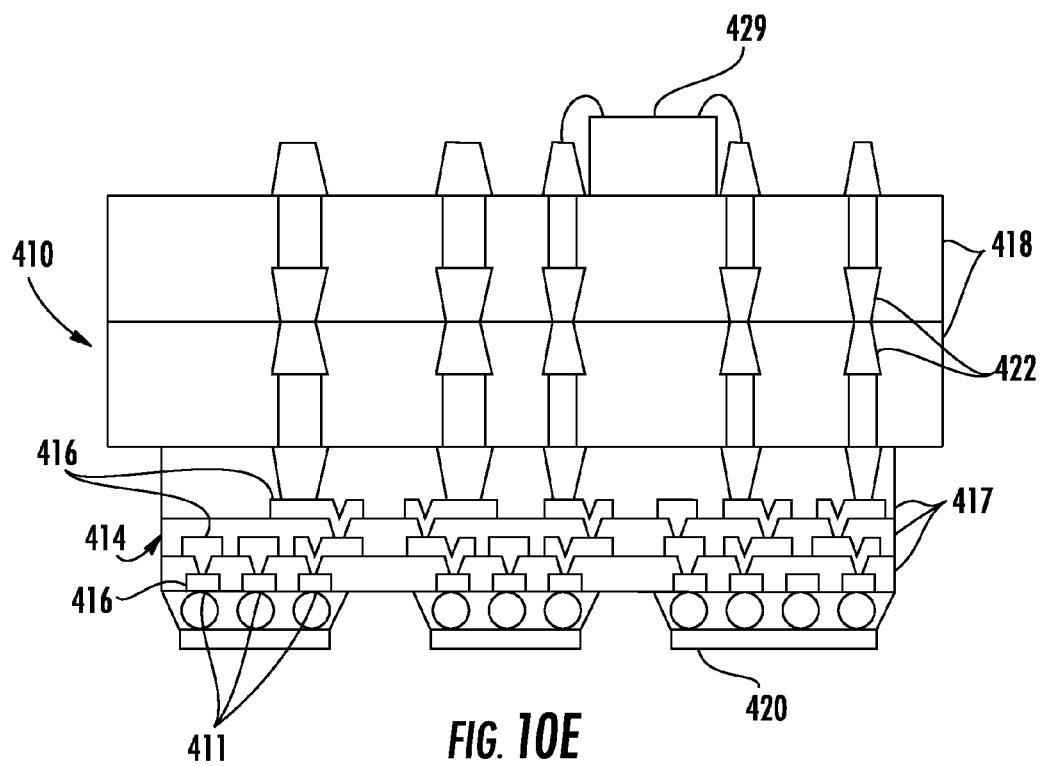

The sacrificial substrate 412 is then removed to expose a lowermost patterned electrical conductor layer 416 (Block 456), as shown in FIG. 10D. At least one first device 420, illustratively a trio of integrated circuit dies, is electrically coupled to the lowermost patterned electrical conductor layer 416 (Block 457), as shown in FIG. 10E. At least one second device 429, illustratively a RF device, is electrically coupled to the conductor vias 422 of the LCP substrate 418, and resides on a side of the LCP substrate 418 opposite the interconnect layer stack 414 (Block 458). Block 459 indicates the end of the method.

This method therefore results in an electronic device 410 comprising a LCP substrate 418 with a plurality of conductor vias 422 formed therein. The LCP substrate 418 comprises a pair of LCP layers. An interconnect layer stack 414 is formed on the LCP substrate 418. The interconnect layer stack 414 comprises a plurality of patterned electrical conductor layers 416, with dielectric layers 417 between adjacent patterned electrical conductor layers. There is a fused seam between the interconnect layer stack 414 and the LCP substrate 418, and between the LCP layers.

Three integrated circuit dies 420 are coupled to the lowermost patterned electrical conductor layer 416 in a flip chip arrangement. A radiofrequency device 429 is coupled to a side of the LCP substrate 418 opposite the interconnect layer stack 414, and is electrically coupled to the uppermost patterned electrical conductor layer 416 and the integrated circuit dies 420 via the electrical conductor vias 422. There is also a fused seam between the LCP substrate 418 and the second device 429.

Other details of methods for making an electronic device 10 may be found in co-pending applications METHOD OF MAKING AN ELECTRONIC DEVICE HAVING A LIQ- UID CRYSTAL POLYMER SOLDER MASK AND RELATED DEVICES, U.S. Publication No. 2012/0182702 published Jan. 14, 2011, and METHOD OF MAKING AN ELECTRONIC DEVICE HAVING A LIQUID CRYSTAL POLYMER SOLDER MASK LAMINATED TO AN INTERCONNECT LAYER STACK AND RELATED DEVICES, U.S. Pat. No. 8,693,203 issued Apr. 8, 2014, and ELECTRONIC DEVICE HAVING LIQUID CRYSTAL POLYMER SOLDER MASK AND OUTER SEALING LAYERS, AND ASSOCIATED METHODS, U.S. Pat. No. 8,472,207 issued Jun. 25, 2013, the entire disclosures of which are hereby incorporated by reference.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method of making an electronic device comprising:
    forming an interconnect layer stack on a glass substrate and comprising a plurality of patterned electrical conductor layers, and a dielectric layer between adjacent patterned electrical conductor layers, with an uppermost patterned electrical conductor layer including at least one pad;
    forming a liquid crystal polymer (LCP) substrate and comprising at least one electrical conductor via;
    aligning the LCP substrate to the interconnect layer stack on a side thereof opposite the glass substrate, with the at least one electrical conductor via being aligned with the at least one pad of the uppermost patterned electrical conductor layer;
    forming a fused seam directly between the interconnect layer stack and the LCP substrate, and while intermetallically bonding the at least one electrical conductor via to the uppermost patterned electrical conductor layer; and
    removing the glass substrate.

2. The method of claim 1, wherein removing the glass substrate exposes a lowermost patterned electrical conductor layer.

3. The method of claim 2, further comprising electrically coupling at least one first device to the lowermost patterned electrical conductor layer.

4. The method of claim 3, wherein the at least one first device comprises a first integrated circuit (IC) die in a flip chip arrangement.

5. The method of claim 1, wherein forming the fused seam and intermetallically bonding comprises applying heat and pressure to the LCP substrate and the interconnect layer stack.

6. The method of claim 5, wherein applying heat and pressure is performed in an autoclave.

7. The method of claim 1, wherein forming the interconnect layer stack comprises forming the plurality of patterned electrical conductor layers by thin film deposition.

8. The method of claim 1, wherein the LCP substrate has a thickness of less than 0.0025 inches.

9. The method of claim 1, wherein the glass substrate comprises an atomically smooth glass substrate.

10. A method of making an electronic device comprising:
    forming an interconnect layer stack on a glass substrate and comprising a plurality of patterned electrical conductor layers, and a dielectric layer between adjacent patterned electrical conductor layers, with an uppermost patterned electrical conductor layer including at least one pad;

forming a liquid crystal polymer (LCP) substrate and comprising at least one electrical conductor via;

aligning the LCP substrate to the interconnect layer stack on a side thereof opposite the glass substrate, with the at least one electrical conductor via being aligned with the at least one pad of the uppermost patterned electrical conductor layer;

using an autoclave to form a fused seam directly between the interconnect layer stack and the LCP substrate, and while intermetallically bonding the at least one electrical conductor via to the uppermost patterned electrical conductor layer; and removing the glass substrate.

11. The method of claim 10, wherein removing the glass substrate exposes a lowermost patterned electrical conductor layer.

12. The method of claim 11, further comprising electrically coupling at least one first device to the lowermost patterned electrical conductor layer.

13. The method of claim 12, wherein the at least one first device comprises a first integrated circuit (IC) die in a flip chip arrangement.

14. The method of claim 10, wherein forming the interconnect layer stack comprises forming the plurality of patterned electrical conductor layers by thin film deposition.

15. The method of claim 10, wherein the LCP substrate has a thickness of less than 0.0025 inches.

16. The method of claim 10, wherein the glass substrate comprises an atomically smooth glass substrate.

17. A method of making an electronic device comprising:
providing an interconnect layer stack on a glass substrate and comprising a plurality of patterned electrical conductor layers, and a dielectric layer between adjacent patterned electrical conductor layers, with an uppermost patterned electrical conductor layer including at least one pad;

providing a liquid crystal polymer (LCP) substrate and comprising at least one electrical conductor via;

aligning the LCP substrate to the interconnect layer stack on a side thereof opposite the glass substrate, with the at least one electrical conductor via being aligned with the at least one pad of the uppermost patterned electrical conductor layer;

forming a fused seam directly between the interconnect layer stack and the LCP substrate, and while intermetallically bonding the at least one electrical conductor via to the uppermost patterned electrical conductor layer; and removing the glass substrate.

18. The method of claim 17, wherein removing the glass substrate exposes a lowermost patterned electrical conductor layer.

19. The method of claim 18, further comprising electrically coupling at least one first device to the lowermost patterned electrical conductor layer.

20. The method of claim 19, wherein the at least one first device comprises a first integrated circuit (IC) die in a flip chip arrangement.

21. The method of claim 17, wherein forming the fused seam and intermetallically bonding comprises applying heat and pressure to the LCP substrate and the interconnect layer stack.

22. The method of claim 21, wherein applying heat and pressure is performed in an autoclave.

23. The method of claim 17, wherein the LCP substrate has a thickness of less than 0.0025 inches.

24. The method of claim 17, wherein the glass substrate comprises an atomically smooth glass substrate.

* * * * *